United States Patent
Miles (10) Patent No.: US 6,794,119 B2
(45) Date of Patent: Sep. 21, 2004

(54) METHOD FOR FABRICATING A STRUCTURE FOR A MICROELECTROMECHANICAL SYSTEMS (MEMS) DEVICE

(75) Inventor: Mark W. Miles, San Francisco, CA (US)

(73) Assignee: Iridigm Display Corporation, San Francisco, CA (US)

(*) Notice: Subject to any disclaimer, the term of this patent is extended or adjusted under 35 U.S.C. 154(b) by 16 days.

(21) Appl. No.: 10/074,562

(22) Filed: Feb. 12, 2002

(65) Prior Publication Data

US 2003/0152872 A1 Aug. 14, 2003

(51) Int. Cl.⁷ .............................. G03F 7/00; G03F 7/26
(52) U.S. Cl. ...................... 430/313; 430/311; 430/314; 430/316; 430/317; 430/318; 430/322; 430/394
(58) Field of Search ................................ 430/311, 313, 430/314, 316, 317, 318, 322, 394

(56) References Cited

U.S. PATENT DOCUMENTS

| | | | |
|---|---|---|---|
| 5,503,952 A | * | 4/1996 | Suzuki et al. ............ 430/7 |
| 5,622,814 A | * | 4/1997 | Miyata et al. ............ 430/314 |
| 5,674,757 A | | 10/1997 | Kim ............ 438/159 |
| 5,972,193 A | * | 10/1999 | Chou et al. ............ 205/122 |
| 5,976,902 A | * | 11/1999 | Shih ............ 438/30 |
| 2001/0040649 A1 | | 11/2001 | Ozaki ............ 349/43 |

OTHER PUBLICATIONS

PCT Search Report, Int'l. Application No. PCT/US02/13442, mailed Sep. 13, 2002, (1 pg.).

* cited by examiner

*Primary Examiner*—Mark F. Ruff
*Assistant Examiner*—Nicole Barreca
(74) *Attorney, Agent, or Firm*—Blakely, Sokoloff, Taylor & Zafman LLP (57) ABSTRACT

The invention provides a microfabrication process which may be used to manufacture a MEMS device. The process comprises depositing one or a stack of layers on a base layer, said one layer or an uppermost layer in said stack of layers being a sacrificial layer; patterning said one or a stack of layers to provide at least one aperture therethrough through which said base layer is exposed; depositing a photosensitive layer over said one or a stack of layers; and passing light through said at least one aperture to expose said photosensitive layer.

15 Claims, 10 Drawing Sheets

METHOD FOR FABRICATING A STRUCTURE FOR A MICROELECTROMECHANICAL SYSTEMS (MEMS) DEVICE

FIELD OF THE INVENTION

This invention relates to microfabrication. In particular, it relates to the microfabrication of a structure for a Microelectromechanical Systems (MEMS) device.

BACKGROUND

Microfabrication techniques used to fabricate MEMS devices generally involve the deposition of one or more layers on a substrate and the subsequent patterning of the layers to produce useful structures. One technique for patterning a layer involves the use of photolithography. With photolithography a photographic definition of a desired pattern on a photo or optical mask is used to impart the pattern onto a surface of the layer. When manufacturing a MEMS device usually several masking steps are required, each masking step adding to the cost of the device. Accordingly, it is desirable to reduce the number of masking steps required during fabrication of a MEMS device.

SUMMARY OF THE INVENTION

According to one aspect of the invention there is provided a microfabrication process comprising depositing a first layer on a substrate; patterning the first layer; depositing a second layer on the first layer; and patterning the second layer using the first layer as a photomask.

DETAILED DESCRIPTION

Aspects of the present invention will now be described with reference to FIGS. 2 to 10 of the drawings which show the stages during fabrication of a MEMS device such as a Visible Spectrum Modulator Array described in U.S. Pat. No. 5,835,255 or an Interferometric Modulater (IMOD) described in U.S. Pat. No. 6,040,937. Naturally, describing the present invention with reference to stages in the manufacture of a Visible Spectrum Modulator Array or an IMOD is intended to enhance understanding of the present invention and it is to be understood that the present invention may used in the manufacture of other MEMS devices. Thus, the description of the present invention with reference to the manufacture of a Visible Spectrum Modulator Array or an IMOD is intended to be non-limiting.

Figure 1:
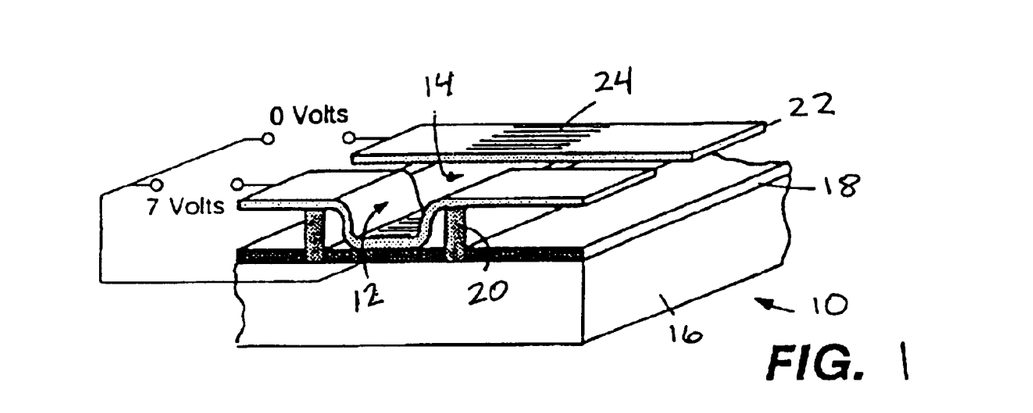
FIG. 1 shows a three dimensional drawing of a part of a MEMS device which may be manufactured using the microfabrication process of the present invention.

FIG. 1 of the drawings shows an example of a part of a Visible Spectrum Modulator Array 10 which may be fabricated in accordance with techniques described herein. Referring to FIG. 1, an antenna array is fabricated on one-half of a microfabricated interferometric cavity which transmits and reflects certain portions of incident electromagnetic radiation depending on (a) the dimensions of the cavity itself and (b) the frequency of response of dielectric mirrors in the cavities. In FIG. 1, the array 10 is shown to include two cavities 12, 14 fabricated on a transparent substrate 16. A layer 18, the primary mirror/conductor may comprise a combination of one or more films of metals, oxides, semiconductors, and transparent conductors. Insulating supports 20 hold up a second transparent conducting membrane 22. Each array element has an antenna array 24 formed on the membrane 22. The two structures 22, 24, together comprise the secondary mirror/conductor. Conversely, the antenna array may be fabricated as part of the primary mirror/conductor. Secondary, mirror/conductor 22/24 forms a flexible membrane, fabricated such that it is under tensile stress and thus parallel to the substrate, in an undriven state.

Because layers 22 and 24 are parallel, radiation which enters any of the cavities from above or below the array can undergo multiple reflections within the cavity, resulting in optical interference. Depending on the dimensions of the antenna array, the interference will determine its reflective and/or transmissive characteristics. Changing one of the dimensions, in this case the cavity height (i.e. the spacing between the inner walls of layers 18, 22), will alter the optical characteristics. The change in height is achieved by applying a voltage across the two layers of the cavity, which due to electrostatic forces, causes layer 22 to collapse. Cavity 12 is shown collapsed (7 volts applied), while cavity 14 is shown uncollapsed (0 volts applied).

Figure 2:
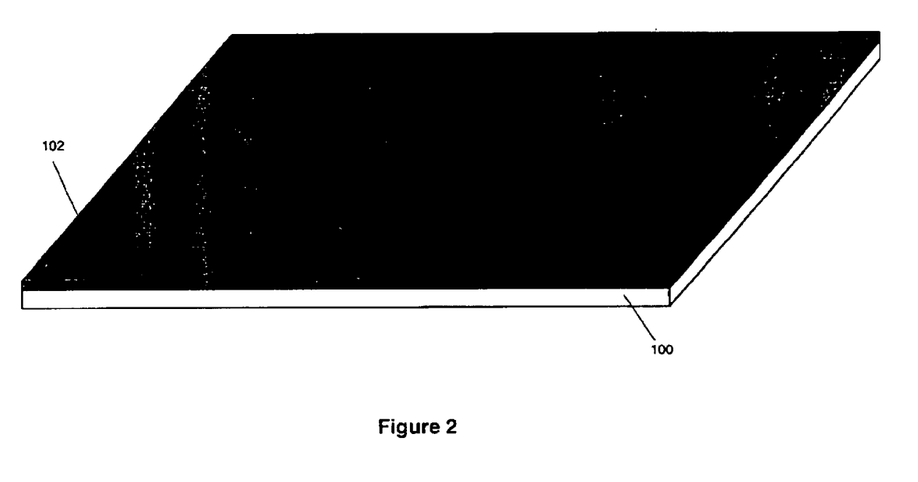
FIGS. 2 to 10 shows various stages in the manufacture of the MEMS device of FIG. 1.

In fabricating the array 10, it is desirable that insulating supports 20 are well defined in regions where contact is made between insulating supports 20 and layers 18, 22. The present invention is especially useful in manufacturing such a support. FIGS. 2 through 10 show various stages in the manufacture of a MEMS device having supports such as the supports 20. Referring to FIG. 2 of the drawings, reference numeral 100 indicates a substrate 100. The substrate 100 may be of many different materials each being transparent to ultraviolet light. Examples of these materials include plastic, mylar, or quartz. The material must be able to support an optically smooth, though not necessarily flat, finish. A preferred material would likely be glass, which would be both transmissive and reflective operation in the visible range.

Various layers are deposited on substrate 100 to define a stack. In particular, the substrate 100 is coated with a sacrificial layer 102 using standard techniques such as a physical vapor deposition (PVD) method such as sputtering or e-beam evaporation. Other possible methods include chemical vapor deposition and molecular beam epitaxy.

In FIG. 2, the sacrificial layer is a single layer. However, in other embodiments of the invention layer 102 may be a stack of layers with an uppermost sacrificial layer.

Figure 3:
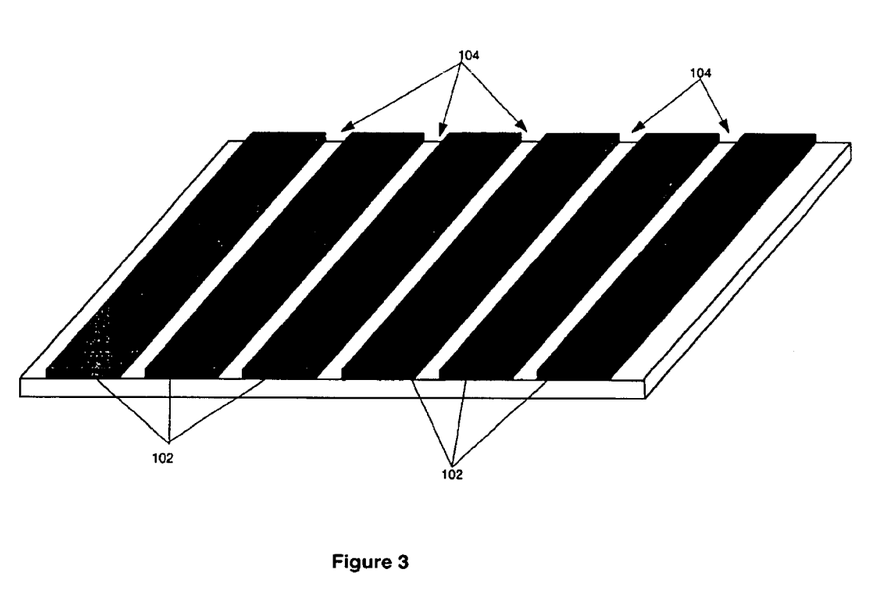

FIG. 3 of the drawings shows a stage in the manufacture of the MEMS device wherein the sacrificial layer 102 has been patterned so as to define longitudinally spaced grooves 104. A standard procedure is used to pattern sacrificial layer 102 which includes exposing layer 102 through an appropriate mask and developing to produce the pattern.

Figure 4:
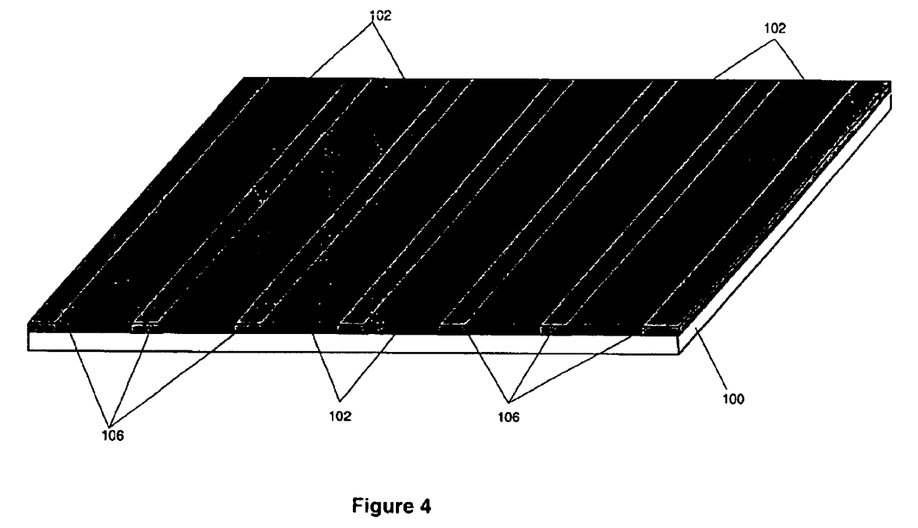
Figure 5:
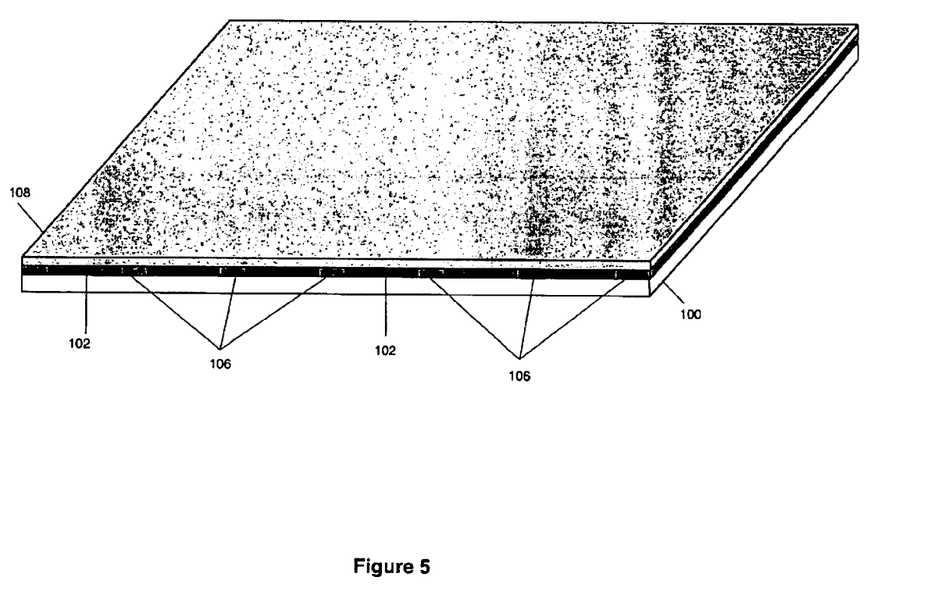

In FIG. 4 of the drawings, a photosensitive polymeric material in the form of a negative-acting-photosensitive material which could be a negative photoresist has been spun onto sacrificial layer 102 with a thickness that is larger than the total height of the film stack defined by layers 100 and 102. Thereafter, the negative-acting-photosensitive material is exposed to ultraviolet light through substrate 100 and developed using conventional techniques. Because the longitudinal grooves 104 are the only means by which the negative-acting-photosensitive material is exposed, the negative-acting-photosensitive material over the stack is dissolved during a subsequent development process, leaving only longitudinal ridges 106 of negative-actingphotosensitive material disposed in grooves 104. Thus, it will be appreciated that by first patterning the sacrificial layer 102 and then exposing the negative-acting-photosensitive material through substrate 100 through longitudinal grooves 104 in the sacrificial layer 102, the sacrificial layer 102 acts as a photomask thereby allowing the negative-acting-photosensitive material to be lithographically patterned without the need for an additional masking step. In FIG. 5 of the drawings, a structural layer 108 has been deposited on the stack and the sacrificial layer 102 has been removed, thus the layer 108 is supported by ridges 106. It will be appreciated that by using different photomasks it will be possible to fabricate support structures of any desired geometry. Thus instead of ridges, in other embodiments pillars or posts may be formed. The layer 108 is highly conductive and reflective and will typically contain aluminum and nickel.

Figure 6:
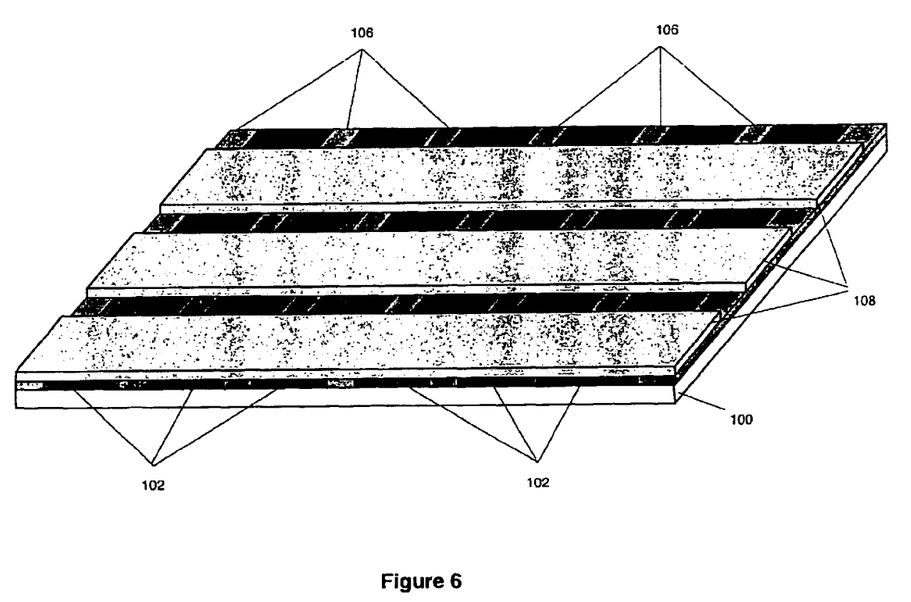
Figure 7:
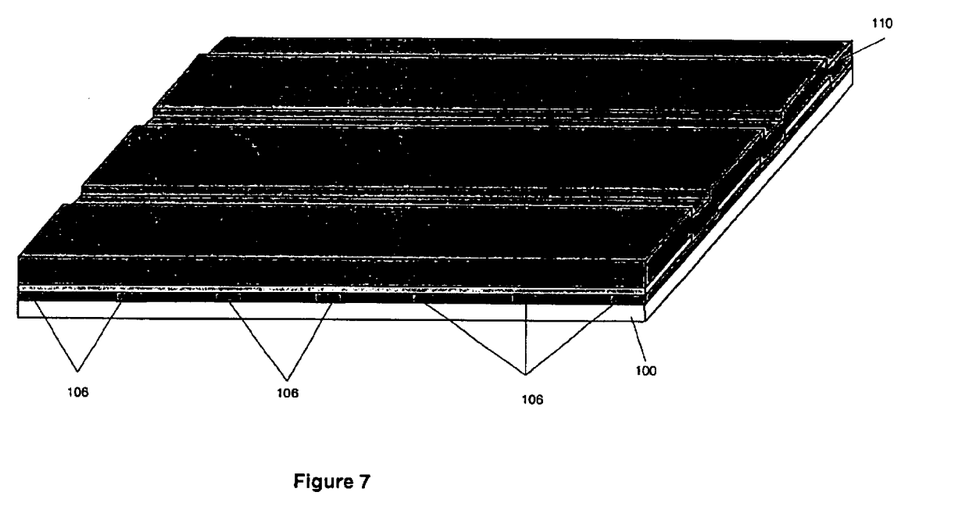
Figure 8:
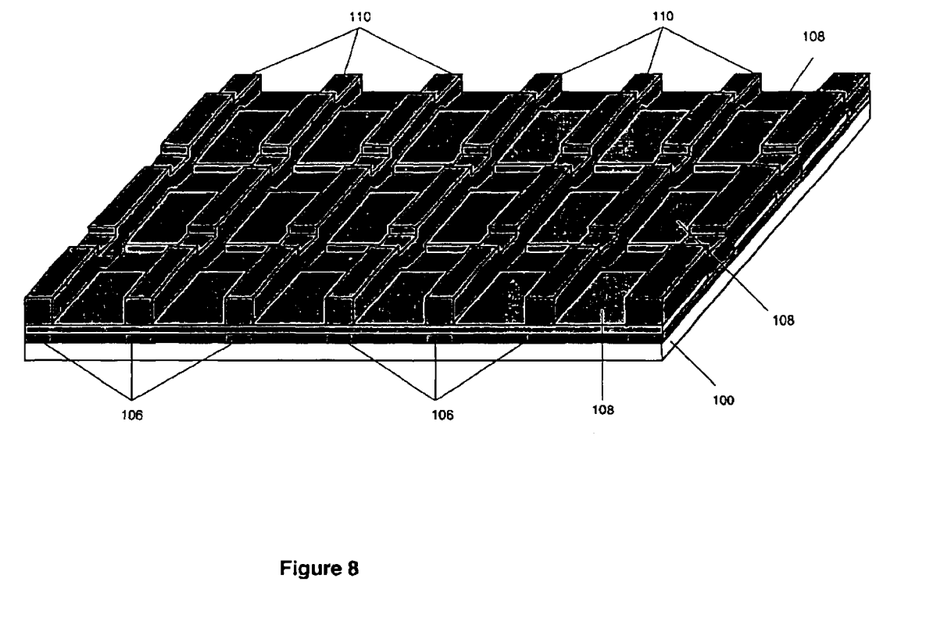
Figure 9:
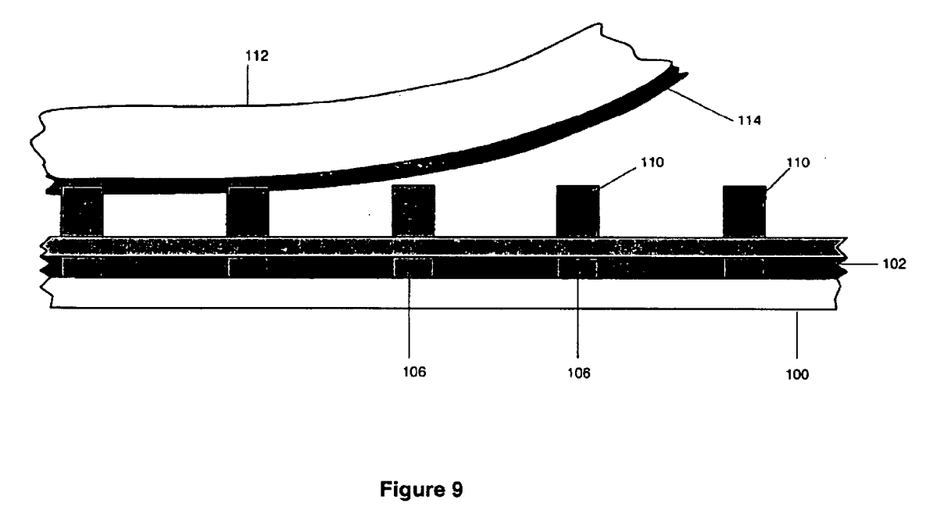
Figure 10:
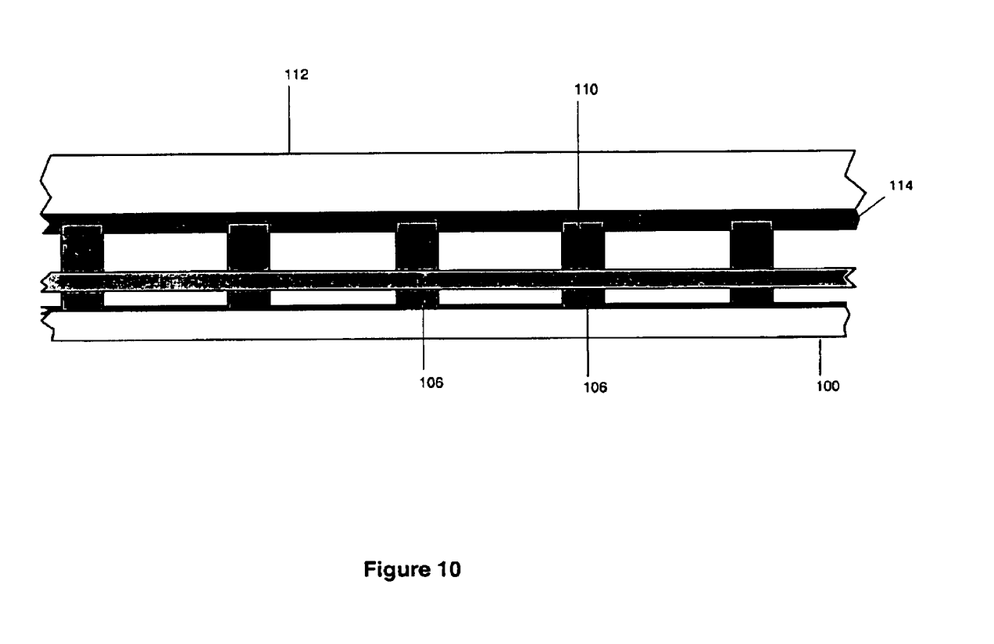

FIG. 6 of the drawings shows a subsequent stage in the manufacture of the MEMS device wherein the layer 108 is patterned into transversely extending strips. FIG. 7 of the drawings shows the film stack with an oxide spacer layer 110 deposited on layer 108. FIG. 8 of the drawings shows a stage in the manufacture of the MEMS device in which the oxide spacer layer 110 has been patterned. FIG. 9 of the drawings shows a stage in the manufacture of the MEMS device in which a sealing film 112 is being applied with a pressure adhesive 114 over the entire structure to protect the structure from damage due to mechanical shock loading and to prevent particulates from interfering with the operation of the IMOD structures. The sealing film 112 could be of a variety of materials such as thin metal films or polymeric films which have been coated with a metal or oxide film to provide hermeticity. Finally, FIG. 10 shows the structure after it has been purged with $XeF_2$ gas to remove the remains of sacrificial layer 102. The edges of the structure are then sealed.

In other embodiments, instead of oxide layer 110 another layer of negative-acting-photosensitive material may be spun over oxide layer 110 and exposed through substrate 100 and using the techniques described above a further set of support structures may be formed. These support structures will provide support for other layers. It will be appreciated that the process may be repeated to build a MEMS structure having multiple layers or "floors" stacked one on top of the other wherein the floors are vertically spaced by support structures fabricated in accordance with the above techniques. One advantage of the present invention is that it provides a microfabrication technique which allows a mechanical support between two layers in an MEMS device to be precisely defined. This allows a clean, well-defined mechanical contact between the support and other structures within the MEMS device.

Further, the present invention uses a patterned layer on a substrate as a photomask to pattern another layer, thereby saving on a masking step.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A microfabrication process for fabricating a microelectromechanical systems device, comprising:
   depositing one or a stack of layers on a substrate;
   patterning said one or a stack of layers to form a plurality of longitudinally extending groves therein;
   depositing a middle layer on said one or a stack of layers;
   patterning the middle layer using said one or a stack of layers as a photomask, wherein said middle layer is exposed to light passed through the groves in the one or a stack of layers; and
   developing said middle layer to form longitudinally spaced ridges in the said middle layer disposed in the groves in said one or a stack of layers, said ridges forming a support structure which is part of the microelectromechanical systems device.

2. The method of claim 1, wherein the substrate permits light to pass therethrough.

3. The method of claim 2, wherein the substrate comprises glass.

4. The method of claim 1, further comprising depositing a top layer over said middle layer.

5. The method of claim 4, wherein said top layer comprises nickel and aluminum.

6. The method of claim 4, further comprising patterning said top layer.

7. The method of claim 6, wherein said top layer is patterned to define transversely extending strips which are supported by the longitudinally spaced ridges in the said middle layer.

8. The method of claim 1, wherein said one or an uppermost layer of said stack of layers is a sacrificial layer.

9. The method of claim 1, wherein the said middle layer comprises a negative-acting-photosensitive material.

10. A method for fabricating a microelectromechanical systems device, the method comprising:
   a) depositing one or a stack of layers on a base layer, said one layer or an uppermost layer in said stack of layers being a sacrificial layer;
   b) patterning said one or a stack of layers to provide at least one aperture therethrough through which said base layer is exposed;
   c) depositing a photosensitive layer over said one or a stack of layers;
   d) passing light through said at least one aperture to expose said photosensitive layer; and
   e) developing said one or a stack of layers to remove unexposed portions of said photosensitive layer and said sacrificial layer to form at least one mechanical support, each support being defined by a portion of said photosensitive layer exposed through an aperture.

11. The method of claim 10, wherein the base layer is a substrate layer.

12. The method of claim 10, wherein said light comprises ultraviolet light.

13. The method of claim 10, wherein said photosensitive layer comprises a negative-acting-photosensitive material.

14. The method of claim 10, further comprising depositing a structural layer over said photosensitive layer.

15. The method of claim 14, wherein said steps (a) to (e) are repeated at least once, wherein for each repetition, the structural layer forms the base layer.

* * * * *